US 6,736,948 B2

(12) United States Patent
Barrett

(10) Patent No.: US 6,736,948 B2
(45) Date of Patent: May 18, 2004

(54) CYLINDRICAL AC/DC MAGNETRON WITH COMPLIANT DRIVE SYSTEM AND IMPROVED ELECTRICAL AND THERMAL ISOLATION

(75) Inventor: Richard L. Barrett, Bay Point, CA (US)

(73) Assignee: Von Ardenne Anlagentechnik GmbH, Dresden (DE)

( * ) Notice: Subject to any disclaimer, the term of this patent is extended or adjusted under 35 U.S.C. 154(b) by 0 days.

(21) Appl. No.: 10/052,732

(22) Filed: Jan. 18, 2002

(65) Prior Publication Data
US 2003/0136672 A1 Jul. 24, 2003

(51) Int. Cl.[7] ............................................... C23C 14/35
(52) U.S. Cl. ........................... 204/298.22; 204/298.08; 204/298.09; 204/298.21; 204/298.28
(58) Field of Search ..................... 204/298.08, 298.09, 204/298.21, 298.22, 298.28

(56) References Cited

U.S. PATENT DOCUMENTS

| 4,169,031 A | 9/1979 | Brors ..................... 204/192 R |
| 4,407,713 A | 10/1983 | Zega .......................... 201/298 |
| 5,047,131 A | 9/1991 | Wolfe et al. ............ 204/192.23 |
| 5,096,562 A | 3/1992 | Boozenny et al. ..... 204/298.22 |
| 5,100,527 A | 3/1992 | Stevenson et al. ..... 204/298.22 |
| 5,108,574 A | 4/1992 | Kirs et al. ............. 204/298.22 |
| 5,171,411 A | 12/1992 | Hillendahl et al. .... 204/192.12 |
| 5,213,672 A | 5/1993 | Hartig et al. .......... 204/298.22 |
| 5,225,057 A | 7/1993 | LeFebvre et al. ...... 204/192.13 |
| 5,262,032 A | 11/1993 | Hartig et al. .......... 204/298.21 |
| 5,298,137 A | 3/1994 | Marshall, III .......... 204/192.12 |
| 5,338,422 A | 8/1994 | Belkind et al. ........ 204/192.12 |
| 5,364,518 A | 11/1994 | Hartig et al. .......... 204/298.22 |
| 5,384,021 A | 1/1995 | Thwaites ............... 204/298.21 |
| 5,445,721 A | 8/1995 | Bower ................... 204/192.12 |
| 5,464,518 A | 11/1995 | Sieck et al. ............ 204/192.12 |
| 5,487,821 A | 1/1996 | Sieck et al. ............ 204/192.12 |
| 5,518,592 A | 5/1996 | Bower et al. .......... 204/192.12 |
| 5,527,439 A | 6/1996 | Sieck et al. ............ 204/192.22 |
| 5,529,674 A | 6/1996 | Hedgcoth .............. 204/298.21 |
| 5,591,314 A | 1/1997 | Morgan et al. ........ 204/298.22 |
| 5,616,225 A | 4/1997 | Sieck et al. ............ 204/298.14 |
| 5,627,435 A | 5/1997 | Jansen et al. ........... 315/111.21 |
| 5,631,050 A | 5/1997 | Thwaites ..................... 427/571 |
| 5,645,699 A | 7/1997 | Sieck ..................... 204/192.12 |
| 5,683,558 A | 11/1997 | Sieck et al. ............ 204/192.12 |
| 5,725,746 A | 3/1998 | Dickey et al. ......... 204/298.21 |
| 5,798,027 A | 8/1998 | Lefebvre et al. ....... 204/192.26 |
| 5,814,195 A | 9/1998 | Lehan et al. ........... 204/192.12 |
| 5,853,816 A | 12/1998 | Vanderstraeten ............ 427/452 |
| 5,904,952 A | 5/1999 | Lopata et al. .................. 427/8 |
| 5,922,176 A | 7/1999 | Caskey ................... 204/192.12 |
| 6,375,814 B1 | 4/2002 | De Bosscher et al. .. 204/298.21 |

FOREIGN PATENT DOCUMENTS

WO     WO 00 00766     1/2000     .......... F16L/230/08

Primary Examiner—Steven Versteeg
(74) Attorney, Agent, or Firm—Parsons Hsue & de Runtz LLP

(57) ABSTRACT

An AC/DC cylindrical magnetron with a drive system that absorbs large variations in the rotation of the target tube, an efficient high capacity electrical transfer system, and improved electrical isolation.

59 Claims, 10 Drawing Sheets

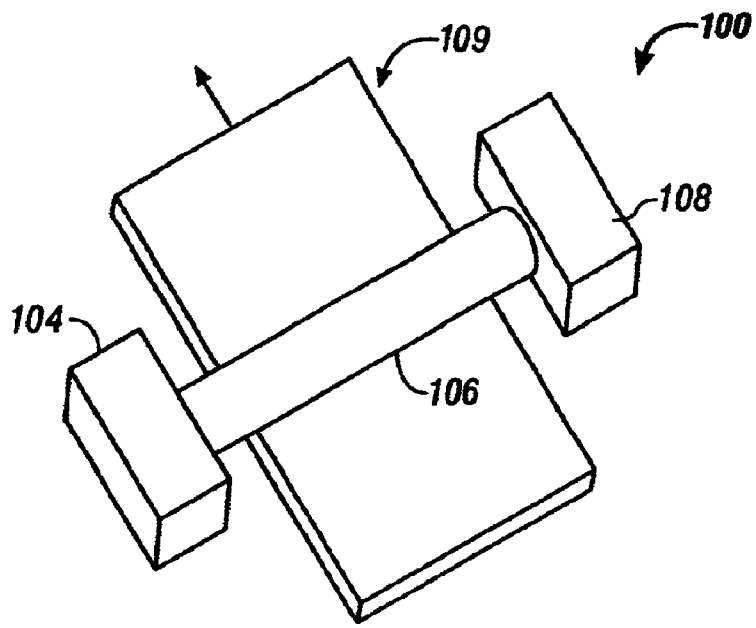
FIG._1A (PRIOR ART)
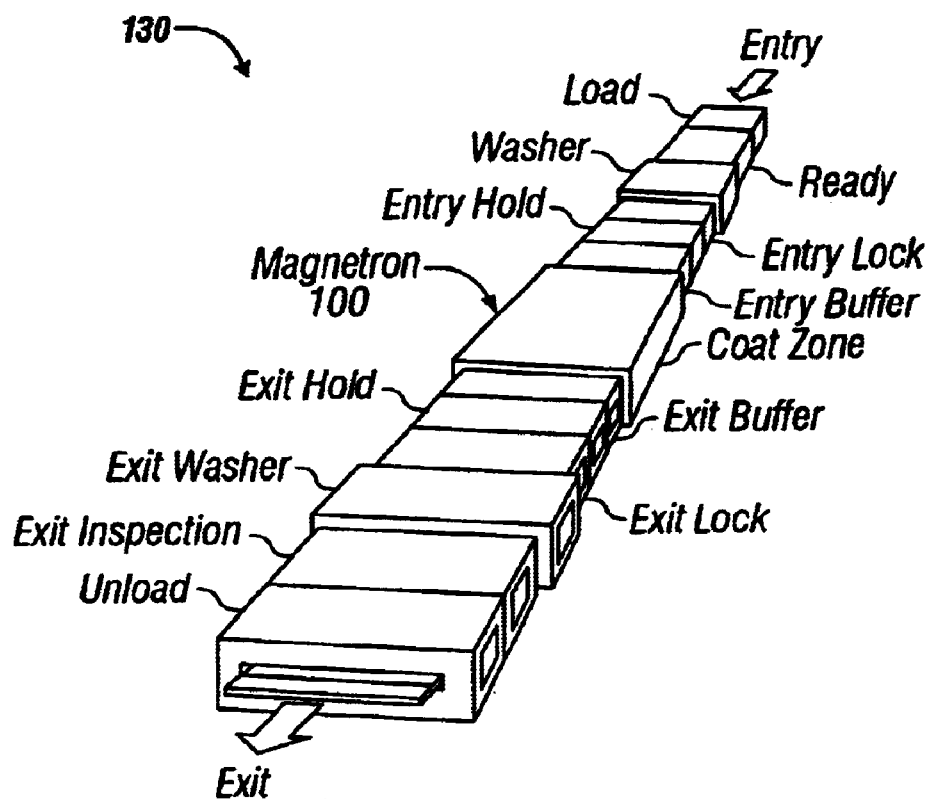
FIG._1B (PRIOR ART)

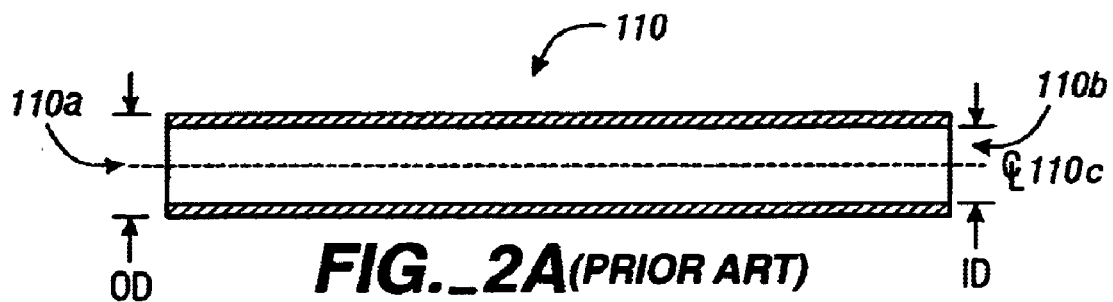
FIG._2A (PRIOR ART)
SIMPLE SAG
FIG._2B (PRIOR ART)
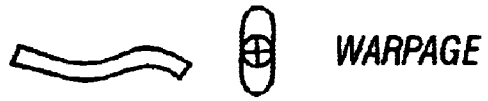
WARPAGE
FIG._2C (PRIOR ART)
COMPLEX WARPAGE
FIG._2D (PRIOR ART)

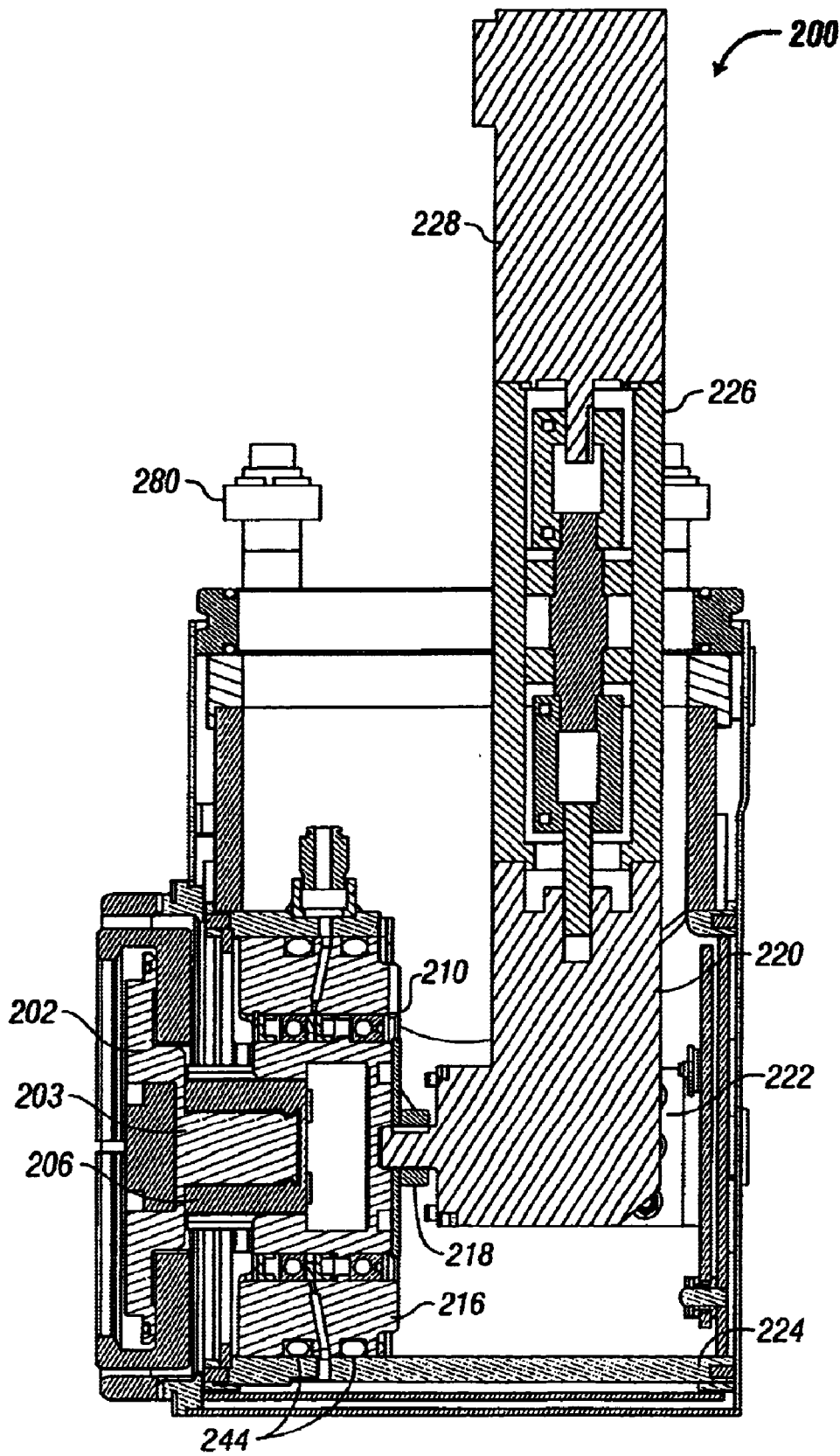
FIG._3

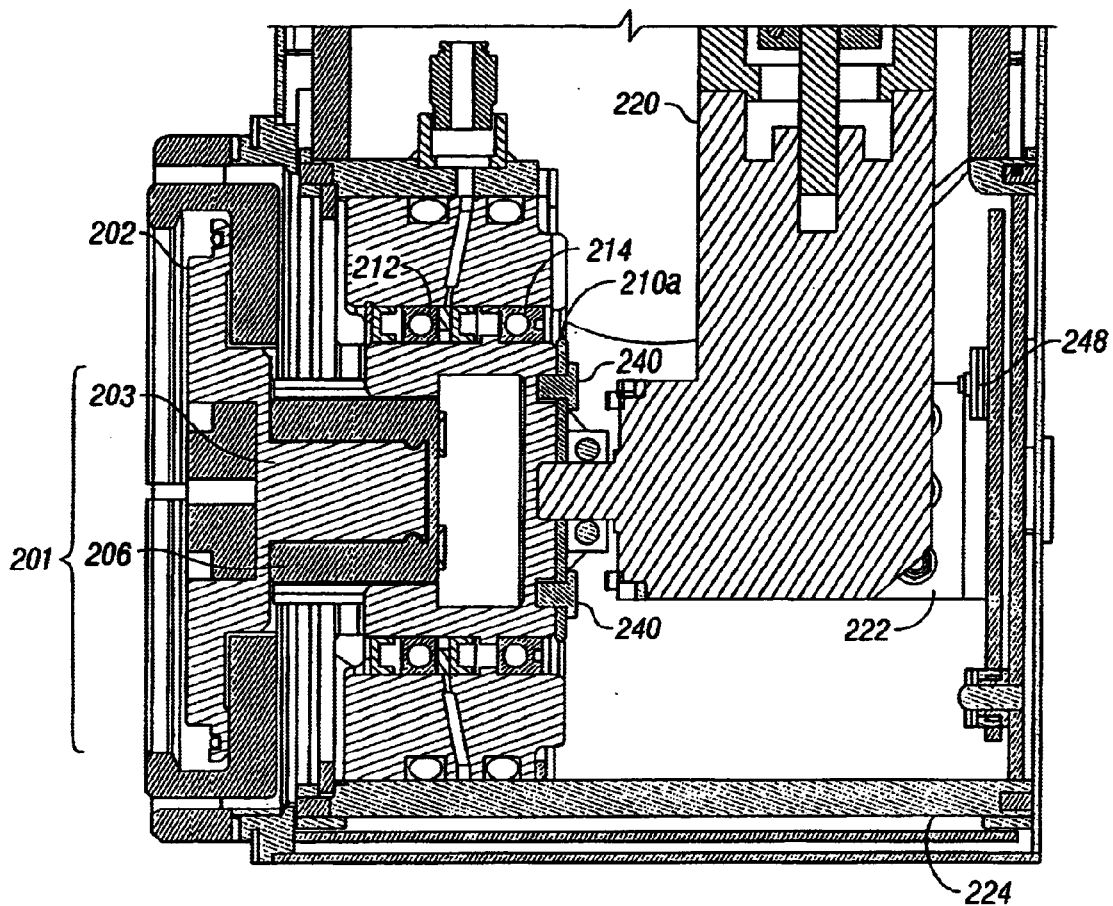
FIG._4
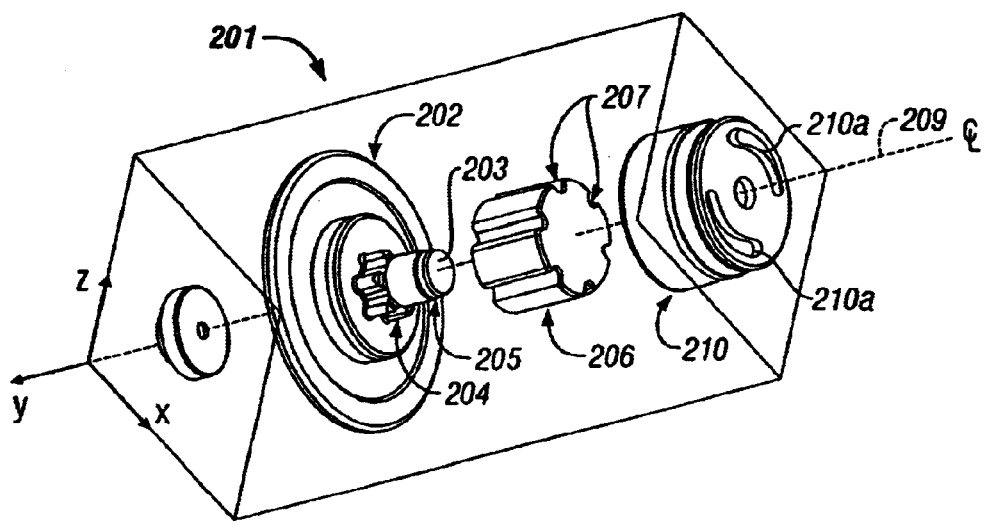
FIG._5

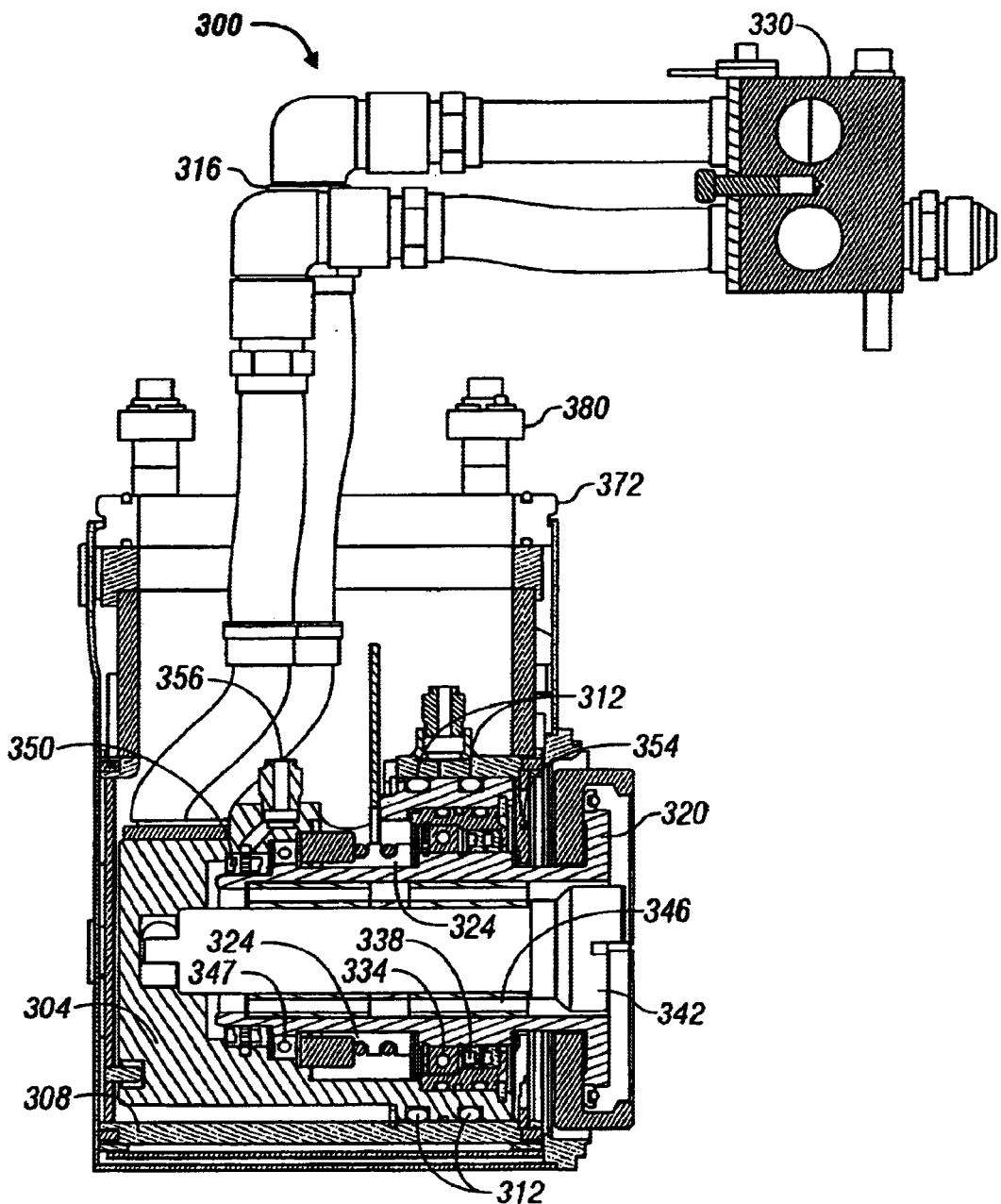
FIG._6

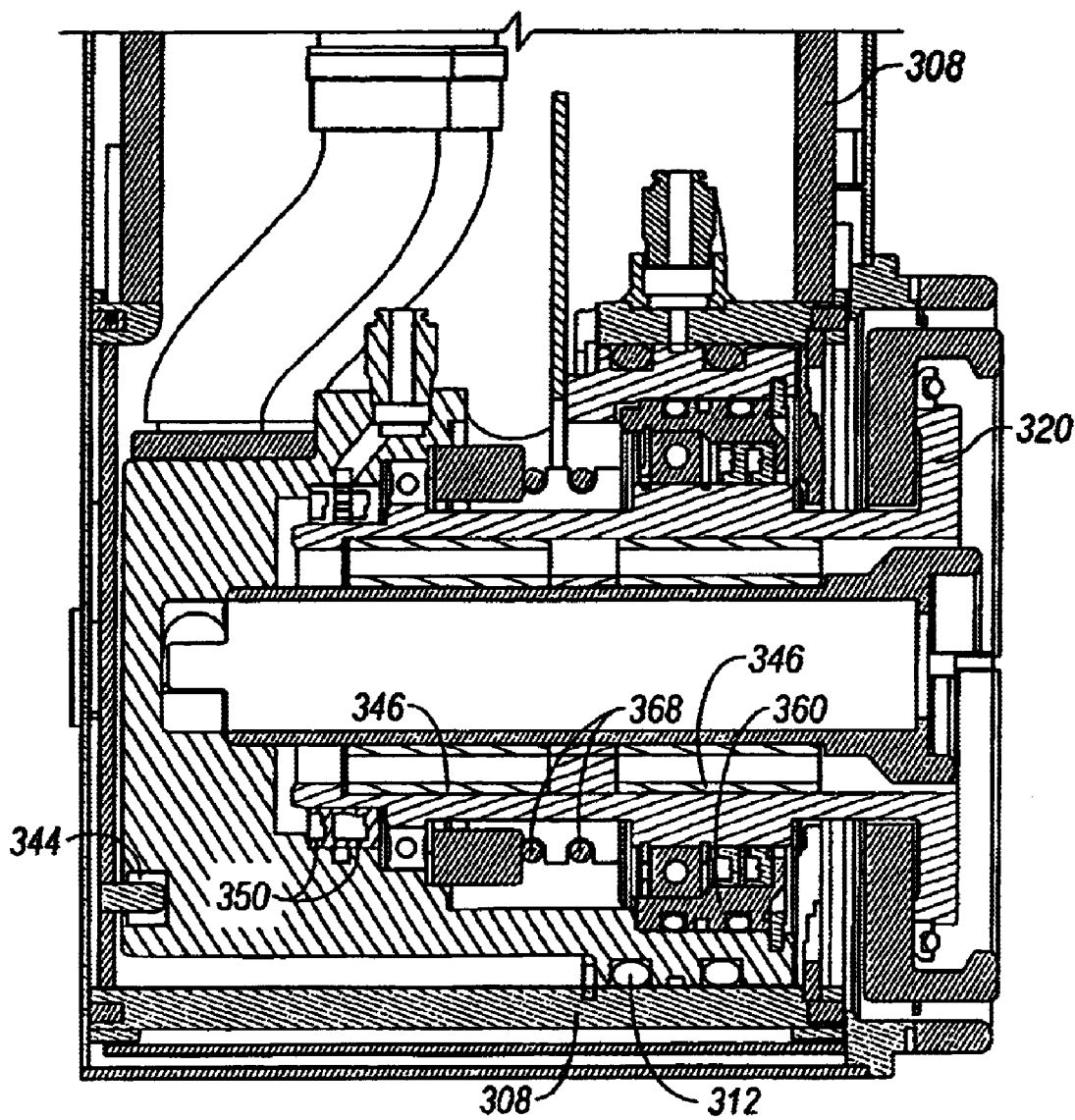
FIG._7

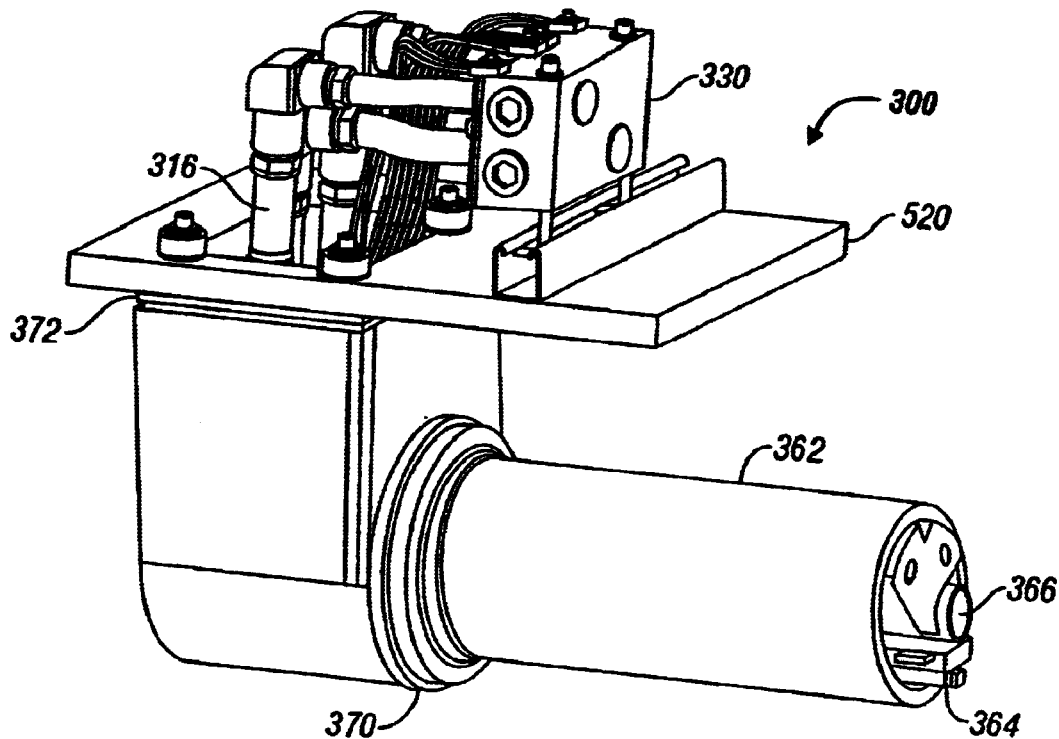
FIG._8
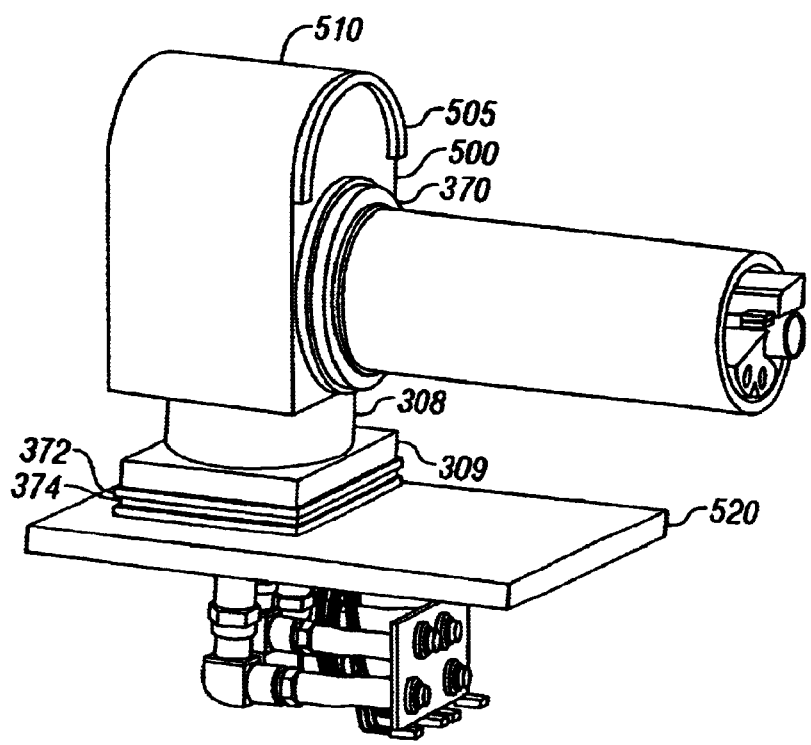
FIG._9

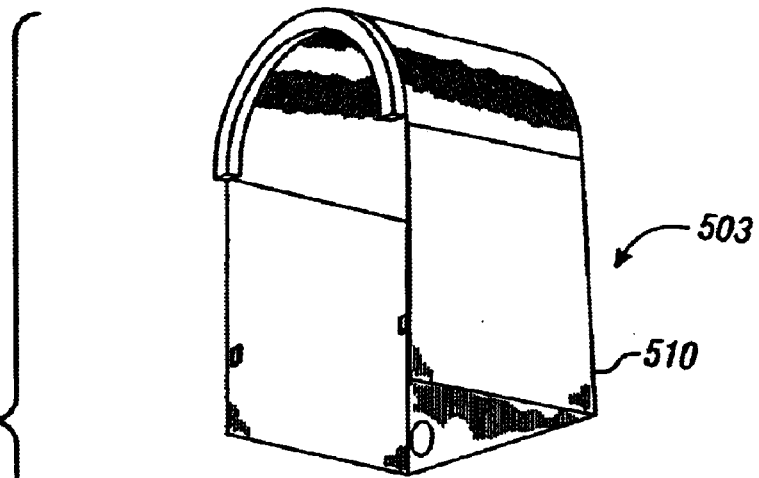
FIG._10
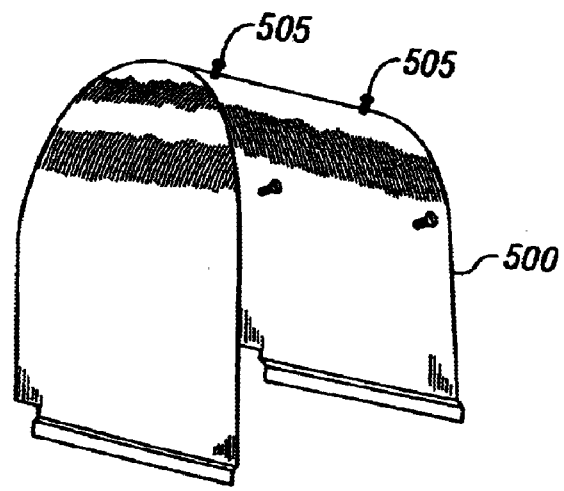
FIG._11

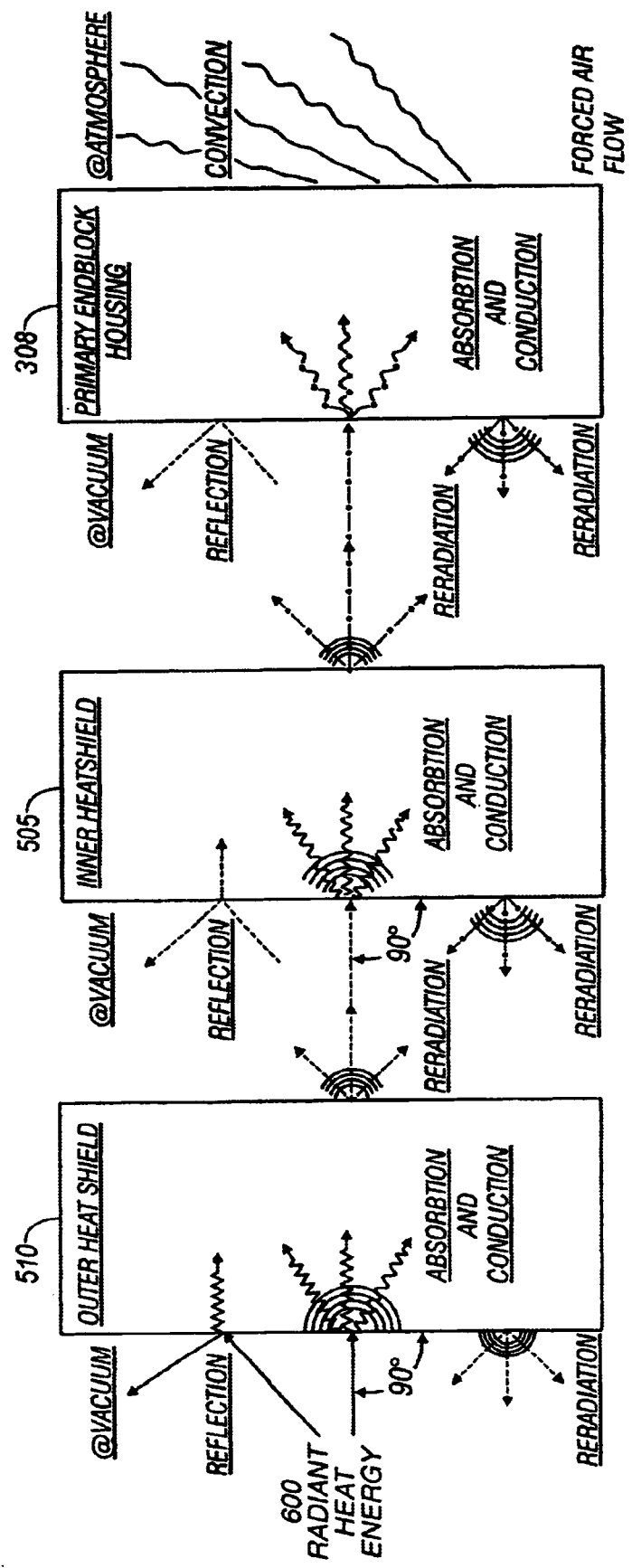
FIG._12

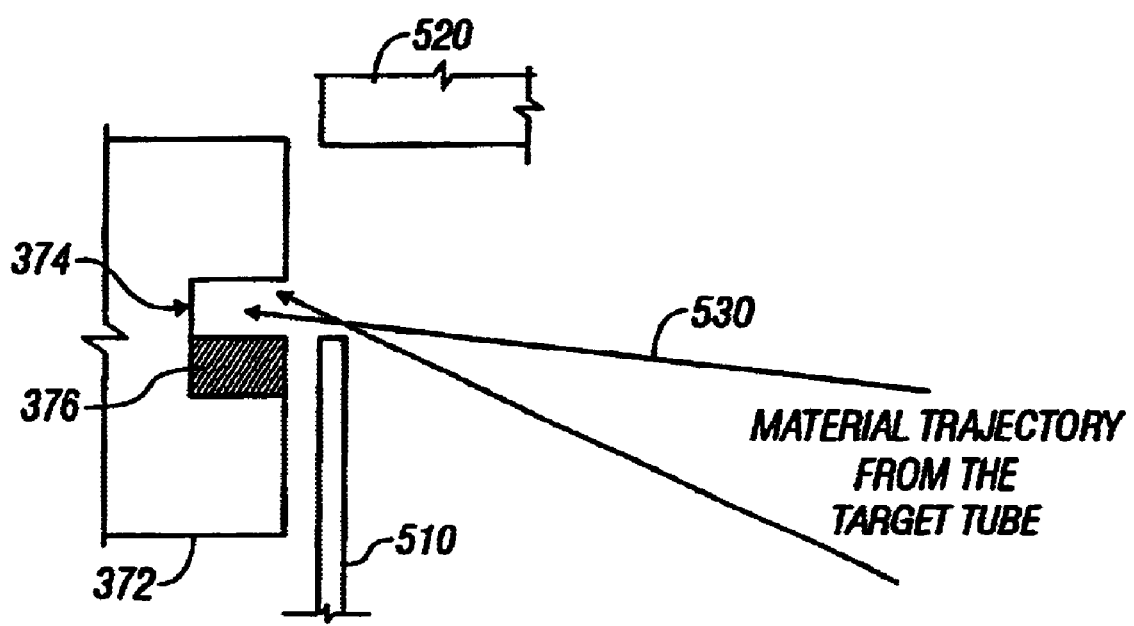
FIG._13

CYLINDRICAL AC/DC MAGNETRON WITH COMPLIANT DRIVE SYSTEM AND IMPROVED ELECTRICAL AND THERMAL ISOLATION

BACKGROUND OF THE INVENTION

The cylindrical magnetron is used in a large coating machine for coating very large sheets of glass or other materials. One application where these sheets of glass are used is in construction of curtain wall buildings where a single glass sheet can be up to 15 feet wide by about 20 plus feet high. The sheets are run through the coating machine shortly after the glass is manufactured. Thus, these are large-scale machines which must rapidly and evenly coat glass as quickly as it can be manufactured. In addition to the quality of the coating the magnetron deposits upon the glass, dependability and serviceability of the magnetron is of the utmost importance.

This is not an easy task taking into account the constraints of the process that is involved. A cylindrical magnetron sputters material from a rotating target tube onto the glass as it is transported past the target. In order to coat such a large piece of glass the target tube can be up to 15 feet in length and 6 inches in diameter and can weigh 1700 pounds. Another complication is that the sputtering actually erodes the target tube during the sputtering process, so the target tube is constantly changing shape during its serviceable lifetime. The sputtering process can require that an extremely high AC or DC power (800 Amps DC, 150 kW AC) be supplied to the target. This power transfer creates extreme heat in the target tube and the surrounding components, which must be cooled in order assure proper performance and to avoid catastrophic failure of the magnetron. Thus, water is pumped through the center of the rotating target tube at high pressure and flow rate. Efficient and effective sputtering also requires that the process take place in a vacuum or a reduced pressure relative to atmosphere. Thus the rotating target must have a very robust sealing system to prevent the high pressure water from leaking into the vacuum environment.

Rotating such a large target tube in such an environment is a difficult task. FIG. 1A depicts magnetron 100 for illustrative purposes. FIG. 1B shows magnetron 100 integrated into a large glass coating system 130. Glass coating system 130 may be several hundred feet long and contain many magnetrons. Target tube 106 is supported by two end blocks 104 and 108 as glass sheet 109 passes by. The end blocks 104 and 108 generally supply cooling water, support and rotate the target tube, support a stationary magnetic array within the rotating target tube, and transfer the large amounts of electricity needed for the sputtering process. Effectively transferring electrical power to a rotating target tube is also a complex problem. Maintaining electrical isolation in a sputtering process is also crucial to continually laying down a uniform coating on the glass. If the drive system is not properly electrically isolated from the sputtering process, it will affect the quality of coating deposited upon the glass. The sputtered material may in fact also coat the drive and electrical components of the magnetron itself rather than the glass if they are not properly isolated. Aside from resulting in a poor coating, this has many other ramifications on the continuous reliable operation of the magnetron. For further information please refer to "Coated Glass Application and Markets" by Russell J. Hill and Steven J. Nadel, The BOG Group, 1999 (ISBN #0-914289-01-02).

The process of sputter deposition occurs at a high electrical potential, typically in an environment of a vacuum (relative to ambient pressure), with or without the addition of a gas to that environment. This potential is attained in DC operations between distinct anodes and cathodes. Typically the target having the material to be deposited functions as the cathode in DC applications. In the case of AC operations which are achieved by the use of dual rotational targets the targets constantly alternate potential and each provides the other the function of anode and cathode to complete the electrical circuit. For electron transfer between the anode and cathode to occur they must be and remain physically and electrically isolated from each other. The present invention transfers electrical power to and from the rotating target tubes in either DC or AC mode at the high power levels required.

Additionally the materials sputtered are often times conductive of themselves. Highly conductive metals such as silver, gold, copper, nickel, chromium and titanium may be applied. These materials differ depending upon the type (color, reflectivity, etc. . . . ) of film desired. Stray material can and does collect within the operational environment surfaces. If this stray material collection is not managed it can accumulate to an extent that it can lead to the failure of the electrical isolation of the cathode and anode resulting in a short between them or the formation of conductive paths that compromise the electrical isolation of other components within the area. This will lead to poor and uneven film quality and will require that the magnetron be disassembled and cleaned, both extremely undesirable consequences. Downtime of the magnetron, and thus the glass making process, is extremely costly and inconvenient for the glass manufacturer.

In either the case of DC or AC operation there are substantial voltages and currents applied to achieve rapid deposition rates to achieve increased production. This electrical energy needs to be carefully managed to have a controllable process that is efficient and safe. To achieve this several unique and novel features have been designed into the magnetron and its endblocks.

To transfer DC or AC electrical power to or from the target tube there are several particular aspects of each form of electrical power that need to be addressed that are not readily apparent. First, in DC operation current flow is through the cross section of the conductor or interface. Second, in the AC frequency range used for sputter deposition, typically referred to as the mid-frequency range (about 30 to 80 kHz or higher), the current flow occurs along the surface, or skin, of the conductor or interface. Penetration of the current into the conductor is minimal and not an easily modeled theoretical calculation. It is dependent upon the material from which the conductor is formed and upon the frequency of the alternating current. As the frequency increases the penetration into the conductor decreases. Third, in AC operation as current, voltage and frequency increase, a phenomenon known as an inductive heating effect can occur in various electrically conductive materials. The inductive depth and magnitude of the inductive heating varies with the shape, orientation and location of the materials relative to the current path of the AC circuit. The inductive phenomenon in this sputtering application is not well understood and there is little literature or documentation available describing its effects and mitigations for practical application. What is known is that metallic conductors can be inductively heated and that the effect increases in a non-linear manner the closer the secondary material is to the AC circuit path.

Inductive heating only occurs in AC operation. As the AC frequency increases the effect increases for a given voltage and current. Inductive heating occurs when high frequency alternating current travels from one point to another through a conductor. Physical contact with the conductor is not necessary for inductive heating to occur. The alternating current induces alternating electromagnetic flux fields around the conductor. These flux fields induce circular electron flow within electrically conductive materials in the vicinity of the fields. The induced circular electron flows are termed eddy currents. The heating of materials within the alternating flux fields is dependent on physical location, material conductivity, coupling, frequency, and power density. Heating of the material increases as the material comes closer to the conductor, as the material magnetic permeability increases, as the frequency increases, and as the power density increases.

FIG. 2A illustrates a cross section of an ideal target tube. Target tube 110 has opposing faces 110a and 110b. In ideal conditions face 110a and 110b will be parallel to each other and perpendicular to the centerline 110c, the axis of rotation of target tube 110. Ideally, the inner diameter at face 110a will be concentric with the outer diameter at face 110a. Likewise, the inner diameter at face 110b will ideally be concentric with the outer diameter at face 110b, and the inner diameter of the tube will be concentric with the outer diameter anywhere along the length of the tube. In reality, this is rarely true because it is not only difficult to manufacture such a tube, but also to inspect the tube throughout its entire length, and thereafter reject it as out of spec. Furthermore, as discussed earlier, the tube actually changes shape during normal operation as material is sputtered from the tube. Face 110a and 110b may not be parallel in one or often multiple axis of reference, as shown in FIGS. 2B–2D. FIG. 2B illustrates a simple sag of the target tube. FIG. 2C illustrates warpage of the target tube above and below the axis of rotation. FIG. 2C illustrates complex warpage of the target tube wherein the warping occurs in more than one plane. The net result is eccentric rotation of the target tube. The length of target tubes can also vary due to machining variations and also from elongation of the tube as it heats up. This elongation is an additional stress in a rigid support system.

Therefore there must be some allowable tolerance for the variation and imperfection in shape of the target tube. Additionally, improved electrical and thermal isolation is needed to prevent costly downtime of the magnetron and the other machines involved in the manufacturing and coating process.

SUMMARY OF THE INVENTION

The endblocks of the cylindrical magnetron provide a unique solution to the problems associated with the operational functions required for sputter deposition of materials utilizing a cylindrical target in DC and AC applications, particularly when high current levels are required for increased rates of deposition.

The present invention adapts to a greater amount of target tube manufacturing and process related variations with angularly compliant mechanisms at each end. The mechanisms also accommodate growth or variations in length of the target tube along the axis. This compliance reduces the transmission of stress within the structure of the magnetron and allows for more consistent and reliable operation.

The invention also simplifies operational alignment, installation, compatibility for retrofit to pre-existing installation sites, assembly, and servicing characteristics.

Electrical isolation is another aspect of the invention. Redundant isolation areas are included to prevent grounding of the device and maintain the floating electrical isolation during operation both initially and over extended periods of usage without maintenance.

Another aspect of the invention are thermal systems to control and minimize the effects of heat generated at static locations where electrical power is provided to the device and at dynamic locations where electrical power is transferred within the device to rotating components. Control and minimization of AC inductive heating is achieved by material selection, construction and geometry taking into account constraints of the sputter deposition process.

Another aspect of the invention incorporates dual water and vacuum sealing to handle the dynamic flow of water through a rotating target in vacuum conditions. The dynamic water seals operate in a primary/secondary set with an unobstructed draining of the interseal area which provides a conditional alarm function while precluding the pressurization of the secondary seal, thereby increasing its operational reliability. The dynamic vacuum seals operate in a primary/secondary set with a differentially pumped interseal area between the primary and secondary seals to provide an effective initial vacuum seal engagement while also providing a backup seal and monitoring between the seals as an added feature for process operations.

Yet another aspect of the invention is the use of chromium oxide surfaces that have been diamond polished to provide wear resistant seal surfaces for both the water and vacuum rotational sealing areas.

BRIEF DESCRIPTION OF THE FIGURES

FIG. 1A illustrates a cylindrical magnetron.

FIG. 1B illustrates the magnetron as part of a glass coating system.

FIGS. 2A–2D illustrate the target tube and imperfections and variations thereof.

FIG. 3 is a cross section of drive endblock 200.

FIG. 4 is an enlarged cross section of drive endblock 200.

FIG. 5 is an exploded view of the drive assembly of drive endblock 200.

FIG. 6 is a cross section of water endblock 300.

FIG. 7 is an enlarged cross section of water endblock 300.

FIG. 8 is a perspective view of water endblock 300.

FIG. 9 is a perspective view of water endblock 300.

FIG. 10 is a perspective view of the shield assembly of water endblock 300.

FIG. 11 is a perspective view of the inner shield of water endblock 300.

FIG. 12 is an illustration of heat shielding and heat transfer.

FIG. 13 is a cross section of the isolation plate and shield assembly.

DETAILED DESCRIPTION OF THE INVENTION

Mechanical Aspects of Operation and Function

Alignment and Rotational Compliance:

The cylindrical targets are manufactured items with initial geometric variations in concentricity, perpendicularity, straightness and surface conditions. From a practical perspective the target tube cannot be perfectly made, and any controlling tolerances are progressively more difficult and costly to affect as the tolerances become smaller and the target length increases. These areas where tolerance is a crucial issue are subjected to substantial amounts of electrical power and subsequent heating necessary for and resultant from the process of sputter deposition. The operational process also induces rotational imperfections and stresses along with those already present from manufacture. Thus, the initially imperfect target tube is changing shape at any given time.

There are two principle ways to control this condition. Provide either a rigid interface or an axially compliant interface to the cylindrical target.

The rigid interface approach is an ineffective solution from a practical mechanics perspective. The large leverage arm and related forces combined with the random variations in target shape and concentricity would require a massive structure that is less effective than a smaller compliant alternative. As the interface becomes progressively more rigid the interface stresses increase disproportionately. This in turn requires the use of increasingly robust construction within a limited envelope (footprint and structure size) which is costly, and more importantly ineffective in contrast to the compliant alternative utilized by the present invention.

The compliant approach is effective in that it adjusts to a wide range of initial and operationally induced variables in the rotation of the cylindrical target. The axial compliance of the cylindrical magnetron of the present invention is similar to the motion of the human hand and wrist about the axis of the lower arm. The hand (target) can rotate while pivoting. Similarly, the components of the endblocks rotate while pivoting in order to accommodate variation in the size and shape of the cylindrical target due changes during the sputtering process or due to manufacturing imperfections, and can also accommodate alignment imperfections. The design and operation of a cylindrical magnetron according to an embodiment of the present invention will now be discussed with reference to the Figures.

Simply stated the device consists of two endblock assemblies that provide physical support to a dynamic cylindrical target and static magnetic array within the target. One endblock provides location, support and rotation to the target tube assembly. This endblock is termed the Drive Endblock (DE). A second endblock provides location, support, water cooling and electrical power transfer for DC or AC operation to the target tube assembly. This endblock is termed the Water Endblock (WE). Imperfect axial rotation is absorbed and accommodated in both endblocks.

Drive Endblock:

The drive endblock is illustrated in FIGS. 3–5. FIG. 3 is a cross section of drive endblock 200. FIG. 4 is an enlarged cross section of the drive area of drive endblock 200. FIG. 5 is an exploded view of drive assembly 201.

The drive endblock 200 interfaces to the target tube assembly (not shown) via drive endcap 202. Drive endcap 202 has a multi-lobed spline 204 on drive endcap core 203. Axial compliance, or freedom of movement about the axis first occurs at the interface between the drive endcap core 203, which has a male multi-lobe spline 204 and insulating member 206. Insulating member 206 has an internal female multi-lobed spline (not shown) that mates with the endcap core with a limited amount of designed in looseness to provide a first compliant coupling with angular or rotational freedom. The inner diameter (ID) of insulating member 206 is larger than the outer diameter (OD) of endcap core 203 and the spline 204 is smaller than the female multi lobed spline of insulating member 206. Thus, the drive endcap 202 can pivot about axis of rotation 209 at this first axially compliant coupling between drive endcap 202 and insulating member 206. "Axially compliant" means that a component, in this case drive endcap 202 can pivot or move about the axis (+/−x and +/−z direction) and can move along the axis (+/−y direction), while rotating about the axis. The drive components do not have a shaft at the axis of rotation and thus are not limited in their range of movement in relation to the axis of rotation.

Referring to FIG. 5, the insulating member 206 is held onto the endcap core 203 by the use of a detent interface 205 between the endcap core 203 and the insulating member 206. The detent retention holds the insulating member without secondary fasteners. This makes changing the target tube a relatively straightforward operation. To couple drive endcap 202 to insulating member 206, the endcap core 203 is heated, for example by putting it into warm water. It is then inserted into insulating member 206 and detent interface 205 snaps into position. Upon subsequent cooling it is then loosely held into position. This loosely held together grouping of drive endcap 202 and insulating member 206 can be popped apart with a screwdriver for disassembly, but will otherwise remain together during assembly and normal operation. For assembly, insulating member 206 is easily slid into drive cup 210. The assembly of drive endcap 202 and insulating member 206 can move and pivot about axis of rotation 209 within drive cup 210 at this second "axially compliant" coupling. Insulating member 206 also has an external male multi-lobed spline 207. This external spline 207 slip fits to the mating internal multi-lobed female spline drive cup 210. This engagement provides for a second axially compliant coupling to provide angular freedom as well as freedom of movement along the axis to accommodate thrust. Thus, the assembly of drive endcap 202 and insulating member 206 can move and pivot about axis of rotation 209 at this second axially compliant coupling within drive cup 210.

The outboard face of drive cup 210 has opposing slots 210a to accommodate drive pins 240 on drive plate 218 secured to the output shaft of gearbox 220. Slots 210a are elongated so it is easy to line up drive cup 210 with drive plate 218 and gearbox 220. As the gearbox rotates, the pins will eventually contact the ends of slots 211 and initiate rotation of endcap 202 and thus the target tube (not shown). This interface between the pins 240 and drive cup 210 is a third axially compliant interface.

The gearbox 220 in FIG. 4 has a mounting structure that allows limited radial and angular deflection. Thus, gearbox 220 itself is axially compliant. Gearbox 220 is mounted to primary housing 224 with compliant isolating gearbox mount bracket 222. Gearbox mount bracket 222 utilizes soft bushings 248 to allow vertical and horizontal movement of the gearbox 220 within drive endblock 200. Thus the gearbox itself can also accommodate longitudinal and vertical movement of the target tube and drive assembly 201. This allows for only the transmission of rotational force from the gearbox 220 to the splined drive cup 210 without adversely affecting the angular degree of freedom of the splined drive cup 210 and isolation housing 216 subassembly. This mounting structure also reduces or eliminates any radial and axial thrust load forces from being transmitted into the gearbox 220.

Drive endblock 200 also provides longitudinal clearance to allow for any thermal expansion/contraction or manufacturing tolerance variances of the target tube. Any variations in length of the target tube, and of the combination of drive assembly 201 and the target tube is accommodated by expansion gap 240 within drive cup 210.

The splined drive cup 210 is rigidly supported by two bearings 212 and 214 along its length within isolation housing 216. The isolation housing 216 fits within the primary housing 224 and is flexibly supported by the primary housing with two compliant seal rings 244 that provide another compliant coupling to accommodate imperfect rotation about axis 209. The isolation housing 216 is retained within the primary housing 224 such that variations in length of the target tube, and of the combination of drive assembly 201 and the target tube are accommodated. The compliant seal rings 244 allow for longitudinal (along the axis) movement of the target tube and drive assembly to allow for thermal or manufacturing tolerance induced variations. Bushings 280 also accommodate movement of primary housing 224 within endblock 200.

The Water Endblock:

The water endblock 300 is illustrated in FIGS. 6, 7, and 8. FIG. 6 is a cross section of the overall endblock, and FIG. 7 is an enlarged cross section of the endblock. FIG. 8 is a perspective view of water endblock 300 together with a part of the target tube.

The water endblock 300 generally supports the rotating target tube 362 while circulating water through the target tube, and providing the electrical power to the target tube for the sputtering process. Water arrives through the dual purpose water manifold/electrical block 330. This brass block is not only a water manifold, but also acts as an electrical manifold and heat sink. For convenience during the assembly process and for subsequent maintenance including replacement of the electrical components and the target tube, the electrical supply lines are broken into replaceable segments. Power is brought to the manifold 330 by a first set of segments (not shown) and connected to segments 340 leading to the target tube. The junction of these segments (not shown) is at the water manifold/electrical block 330. The high current and voltage carried by these segments is transferred at the water manifold so that the high heat that will develop at the junction between the wire segments is dissipated by the water cooled brass block 330. The water then flows through flexible water lines 316 made of a compliant material such as rubber. In FIGS. 6 and 7, only two of the four water lines are shown. In FIG. 8 all four water lines can be seen.

Flexible water lines 316 enter the water endblock primary housing (WEPH) 308 and connect to water endblock isolation housing (WEIH) 304. WEIH 304 incorporates a water spindle 320 that accomplishes multiple functions such as supporting and locating a stationary magnetic array internal to the target tube 362, transferring the electrical power to/from the target tube 362 via the electrical brush blocks 324 and providing the interface for the supply and return flow of target tube cooling water through water lines 316. The water spindle 320 is isolated from direct electrical contact with the primary housing 308 by the isolation housing 304. Water spindle 320 is made of 304 stainless steel because the strong electrical field surrounding the spindle and the current flowing through the spindle will not produce large amounts of inductive heat in a cylindrical form made of 304 stainless steel. Simply stated, 304 stainless steel has been found to be largely immune to the effects of inductive heating, especially in cylindrical geometries.

Within water spindle 320 is another spindle—anti-rotation spindle 342. Dual vacuum seals 350 are located between WEIH 304 and water spindle 320 and seal the high pressure water from the surrounding vacuum environment and vice versa. Between the two seals a water sensor determines if the first seal has been breached and triggers a status alert at the user interface. The water sensor is connected to and monitors interseal cavity port 356. Flow through water bushings 346 are located between water spindle 320 and anti-rotation spindle 342. The anti-rotation spindle 342 holds the magnetic array 364 within the target tube stationary while the water spindle 320 is rotating around it and water is flowing within and around the anti-rotation spindle 342.

Water first passes through anti-rotation spindle 342 and then through a support tube 366 that supports the magnetic array through the length of the target tube 362. The support tube 366 has a smaller diameter than the target tube and fits concentrically (or eccentrically) within the target tube 362. The water travels to drive endblock 200 within support tube 366 and then returns within target tube 362 outside of support tube 366 in the opposite direction and back into the water endblock 300. It enters water endblock 300 in the gap between water spindle 320 and anti-rotation spindle 342. It then flows through flow-through bushings 348 and exits the isolation housing 304 through water lines 316.

Power is applied to the water spindle 320 by brush blocks 324, which then transfer the power to the target tube 362 between water end block 300 and drive endblock 200 shown in FIGS. 3–5. The current travels from brush blocks 324 through water spindle 320 towards the target tube 362. Brush blocks 324 are flanked on both sides by bearings so that water spindle 320 can rotate within isolation housing 304, primary housing 308 and water endblock 300. On the outboard side (away from the target tube) is outboard bearing 346 which is conventional bearing made of steel or other commonly employed material. On the inboard side (towards the target tube) of the brush blocks 324 is bearing 334. Thus the current passes by inboard bearing 334 on a path to the target tube but does not pass by outboard bearing 347. Bearing 334 is a full ceramic bearing. The ceramic material has the advantage of being non-conductive, which means it will not heat up due to AC induction resulting from the current flow even though bearings 334 contact water spindle 320 in the current path from the brush blocks 324 to the target tube. The area of water spindle 320 that comes in contact with ceramic bearing 334 and water seals 350 is the most critical for bearing performance and water sealing. This area of water spindle 320 has a wear resistant, precision ground, hard chromed, and polished contact surface. This surface is created by depositing a hard chrome layer and then precision diamond lapping it. The ceramic bearing 334 is supported by bearing and seal carrier 360. Carrier 360 also supports dual vacuum seals 338.

The compliance within the water endblock 300 occurs at the interface of the WEIH 304 and the WEPH 308. The isolation housing 304 is supported within the primary housing 308 by two compliant seal rings 312 that provide support but also angular freedom. WEIH 304 is retained within WEPH 308 with a relatively high amount of clearance between the outer surfaces of WEIH 304 and the inner surfaces of WEPH 308 so that WEIH 304 can "wiggle" within WEPH 308. This "wiggle room" or clearance is provided so that eccentric or axial movement of the target tube is absorbed by movement of WEIH 304 within WEPH 308. Maintaining the clearance and thus electrical isolation (non contact) is essential for the sputtering process. The compliant seal rings 312 are made of rubber or any other well known compliant material allow for this movement, as are water lines 316 and bushing 344.

Electrical Power Transfer and Isolation:

The electrical power transfer interface occurs within the Water endblock assembly 300 shown in FIGS. 6, 7, and 8. There are four semi-cylindrical radial brush segments that are kept in forced compressive contact to a 304 stainless steel (SST) spindle shaft 320 which has a wear resistant hard chromed, precision ground, and polished contact surface. They are arranged around the diameter of the spindle shaft. The compressive inward force exerted on the brush segments 324 toward the spindle 320 is accomplished by two garter type springs 368 designed to provide an optimized contact force. The optimal force is a compromise: high compression increases the electrical transfer rate but the friction taxes the drive system, whereas low compression and friction allow easy rotation but result in poor electrical transfer efficiency. Also, as the contact force is progressively decreased the electrical interface becomes less efficient which may lead to arcing at the interface. If the contact force is progressively increased the resultant friction at the interface increases which results in excessive brush wear and increasing rotational drag. Thus, an amount of force sufficient to prevent arcing yet resulting in adequate brush life must be maintained by the system.

For continuous DC operations the electrical transfer interface (the brush blocks, wiring to the brush blocks, and the water spindle) was designed to conservatively and reliably handle currents of 800 AMPS. For continuous AC operations the electrical transfer interface was designed to conservatively and reliably handle operations of 150 kW. There is reserve capability in both DC and AC operation to allow for excess transient loads and potential higher power level operations should more powerful power supplies become available.

As discussed in the background the effects of inductive heating are quite dramatic in a high powered AC system. The heating of materials within the alternating flux fields is dependent on physical location, material conductivity, coupling, frequency, and power density. Heating of the material increases as conductive material comes closer to the conductor, as the material magnetic permeability increases, as the frequency increases, and as the power density increases.

Experimentation has shown that the inductive effect occurs only in relation to regions surrounding the current path. This experimentation has demonstrated that if a portion of a component is at an AC electrical potential but is not conducting current the region surrounding this portion does not inductively heat. This device uses full ceramic bearings, non-inductive materials and non-metallic low drag rotational seal rings to eliminate inductive heating effects in the most critical areas surrounding the current path. The experimentally recognized material characteristics associated with 304 SST for metal components minimizes inductive heating effects.

Ceramic bearings are typically utilized in chemical process applications where other materials may pose a contamination problem, or in high speed applications where they are desired because of the lower mass of the bearing and the durability of the material, or in high temperature applications where they are relatively unaffected by the temperature and have the ability to run with little or no lubrication. In this device the use of a full ceramic bearing is unique in that this type of bearing will not inductively heat. Similarly non-metallic low drag rotational seals are used for vacuum seals 354 to avoid the unwanted inductive heat generation.

Electrical Isolation:

Electrical isolation is achieved through multiple redundant features. Generally, the endblocks have shields surrounding primary housings that intern surround internal isolation housings, as can be seen in FIGS. 8 through 11. Additionally, the components within the isolation housings are electrically isolated from each other where appropriate.

The magnetron electrically floats the primary housings and shields of both the drive endblock 200 and the water endblock 300 for operational integrity. This is accomplished by the use of electrically insulating materials and design features. Although these features are common to both endblocks they will now be described with regard to the water endblock 300. Water endblock numbers are the same as drive endblock numbers except the water endblock numbers commence with 3xx whereas drive endblock numbers commence with 2xx. Common to both endblocks are isolation bushings 280/380 surrounding the mounting bolts that adhere the source cover to the primary endblock housing. A substantial isolation plate 372 is located between the primary housing 308's mounting flange 309, the inner shield 500 and the source cover 520. This isolation plate 372 incorporates a perimeter groove 374. This groove 374 is incorporated into isolation plate 372 in order to handle the accumulation of surplus deposition, which will be discussed later. The isolation plate 372 also incorporates visual design features to assure proper orientation at assembly.

The design and function of inner and outer heat and deposition debris shields 500 and 510 are common to both endblock assemblies. Mounted on the external process side of the primary endblock housing are inboard and outboard isolation rings that locate and electrically isolate the shield assemblies from the primary housing. Outboard isolation ring 370 can be seen in FIG. 8. Beneath the outboard isolation ring 370 is the inboard isolation ring (not shown).

Referring to FIGS. 9 and 10, two shields can be seen, an inner shield 500 and an outer shield 510. Inner shield 500 fits within outer shield 510, and both inner shield 500 and outer shield 510 are placed on the primary housing of either the drive endblock 200 or water endblock 300 described earlier. The water endblock is shown in FIGS. 8 and 9. The inner shield 500 is electrically isolated from both the primary housing 308 described earlier and from outer shield 510. On the outboard face of the inner shield 500 are several shouldered insulating bushings 505 that maintain an insulating gap between the shields thus allow the shield to be fastened to the primary housing 308 while maintaining electrical isolation of both shields 500 and 510 relative to the primary housing 308.

The outer shield 510 interfaces with the perimeter of the isolation plate 372 located between the primary housing and the source cover 520 as can be seen in FIG. 8. This interface is shown in further detail in FIG. 13. The groove 374 in the perimeter of the isolation plate 372 and outer shield 510 form a shadow barrier 376. The process of sputter deposition, as mentioned previously, generates surplus deposition material 530 which depending upon the process and target material can be conductive. The shield 510 in conjunction with groove 374 form a non-contacting 'shadow' barrier 376 surrounding the end blocks 200 and 300. The shield 510 floats electrically isolated from the endblock primary housing 308 (in the case of the water endblock 300) and the source cover 520. The potentially conductive surplus deposition material 530 coats anything in the interior of the process area, including the shield 510.

This stray material 530 could form a conductive link between shield 510 and isolation plate 372 if not for the shadow space. Because the shield 510 is positioned in front of the groove 374 in the trajectory of the incoming material 530 from the target tube, the material cannot possibly conductively link the shields to the source cover 520 or primary housing behind the source cover. There will always remain a shadow space or gap in the buildup of stray material that may occur. In other words, the shadow barrier 376 precludes the formation of a conductive link of operational plasma from forming a short circuit. In particular the interface between the shield assembly 503 and the base of source cover 520 is protected from this occurrence by the shadow barrier 376 formed by the lip of the shield and the perimeter groove of the isolation plate. This allows for protracted periods of process operation without maintenance because if the conductive link is formed the magnetron will have to be disassembled and cleaned. This is because the sputter deposition process would be less efficient and the coating deposited upon the glass may also be uneven and varied in quality because of this short circuit. This electrical isolation provides protection from voltages exceeding 100,000 volts and is applicable to both DC and AC process operations.

Within the shields, the endblocks feature secondary isolation housings within the primary housings. The isolation housings are supported on non-conductive compliant seal rings within the primary housings (that interface to the target tube). The endblocks electrical isolation designs diverge at this point and will be explained separately.

Drive Endblock 200:

In addition to the above mentioned electrically isolating features, the drive endblock 200 incorporates isolating features within the drive assembly 201 seen in FIGS. 3–5. Drive assembly 201 incorporates a metallic spline cup 210. This spline cup 210 interfaces with insulating member 206, which intern interfaces with drive endcap 202, which intern interfaces with the target tube. Thus, the target tube is isolated from gearbox 220 and the other components within the primary housing 224. While this benefit is readily apparent, there is a secondary aspect. In the low pressure (vacuum) operational environment necessary for proper sputtering, there can occur a cathode/anode effect if the spline cup 210 is at any potential varying even slightly from ground. This slight potential can result in arcing between the spline cup 210 and other components of the system. To preclude this from occurring the gearbox mounting bracket 222 isolates the gearbox from the primary endblock housing 224 through the use of insulating components and bushings. There is an isolating adapter 226 between the servo drive motor 228 and the gearbox 220 to ensure that a ground potential does not occur via the servo motor 228 case ground or the servo power and controller circuits (not shown). This system of multiple and redundant isolation ensures that the dynamic components such as gearbox 220, drive assembly 201, target tube 362 and servo motor 228 are isolated from each other and precludes the formation of any potential of a cathode/anode effect.

Water Endblock 300:

The Water endblock isolation housing 304 incorporates a spindle 320 that accomplishes multiple functions such as supporting and locating a stationary magnetic array internal to the target tube (through anti-rotation spindle 342), transferring the electrical power to/from the target tube via the electrical brush blocks 324 and providing the interface for the supply and return flow of target tube cooling water through water lines 316. The spindle 320 is isolated from direct electrical contact with the primary housing 308 by isolation housing 304. The electrical brush blocks 324 are also within isolation housing 304. The brush block leads (not shown) are individually insulated and are routed as a centrally located bundle within the primary endblock housing 124 to the water manifold/electrical block 330. The water supply and return lines 316 are insulated and incorporate flexible segments between the isolation housing 308 and the water manifold/electrical block 330. The water manifold/electrical block 330 is mounted on an electrically isolating plate, isolation plate 372, mounted to the interior top surface of the source cover 520 seen in FIGS. 8 and 9.

Thermal Aspects of Operation and Function:

Heat affecting the device is generated from multiple sources. Primarily heat: 1.) is generated at the electrical transfer and interface locations, 2.) results from inductive heating in AC operations, 3.) is generated by the movements of the drive components, and 4.) is radiated from the sputter deposition process. The device uses several approaches to minimize, eliminate, and remove residual heat where possible.

Electrical Power Transfer Heating:

Heating due to the transfer of electrical power to and from the target tube has been controlled, minimized or eliminated by several features. First, conservatively oversized electrical conductors for DC and AC operations minimize heat generation. Second, conservative or oversized electrical junctions or interfaces such as the large contact face of brush blocks 324 upon water spindle 320 and at the junction of conductors 340 to water manifold/electrical block 330. Third is the minimization or elimination of physical structures subject to AC inductive heating, which was previously discussed. This particular aspect also aids in raising the operational efficiency by reducing the power losses associated with inductive heating effects. This is because if an element is inductively heated the increased temperature results in increased resistance and thus decreases the conductivity and the efficiency of the system.

Location of the brush block segments 324 directly upon the water cooled spindle 320 ensures that whatever residual heating that may occur at this interface is immediately quenched. Also the location of the supply and return water lines and the external power supply junction in the same block 330 ensures that whatever residual heating that may occur at this interface is immediately quenched.

Drive System Heating:

The heat created from the drive system and rotation of the target tube is minimized by reducing the torque needed to turn the target tube and other related components. Additionally, heat that is generated is cooled with forced air cooling within the primary housings 308 and 224. In prior designs this was typically accomplished via water cooling within the primary housings often resulting in condensation when the temperature of the housings dropped below the ambient dew point. This condensation within the endblocks resulted in degradation and short circuiting of electrical components within the primary housings. With dynamic forced air flowing within the primary housings, precludes the formation of gross condensation within the housing.

Referring to FIGS. 9–12, the shields and heat transfer of radiant heat from the sputtering process will be described. FIG. 12 in particular illustrates the heat transfer between the shield components and the primary housing.

The transfer of heat in a vacuum between a non-contacting source, i.e. process plasma, and the device is that of radiant heat transfer. To minimize this transfer of heat to the interior of either endblock a multi piece curved shield assembly 503 surrounds each endblock. The multi-piece shields of the water endblock 300 are seen in FIGS. 9–11.

As seen in FIG. 12, the radiant heat energy 600 from the process arrives at the left side of the page. Radiant broad spectrum energy is absorbed in a line of sight path from the heat source to the shield surface. If the incident angle is perpendicular to the shield surface a majority of the energy is absorbed into the shield. As the angle of incidence diverges from the perpendicular there is an increased percentage of that energy which is reflected away and never absorbed. Therefore heat shields 505 and 510 are curved and designed so that the incident angle is other than perpendicular wherever possible. Heat that arrives at an angle of less than or greater than 90 degrees is partially reflected whereas heat that arrives at ninety degrees is predominantly absorbed by outer heat shield 510. Note that there is a vacuum on both sides of outer heat shield 510, and therefore convection is not possible.

Heat that is absorbed by outer heat shield 510 is re-radiated from both sides equally. The surfaces of the shields are reflective in order to minimize the absorption. The heat that is re-radiated towards inner heat shield 505 is partially reflected and partially absorbed by inner heat shield 505. It is then re-radiated once again in both directions, part back towards outer head shield 510 and part towards primary endblock housing 308. Thus, only a small fraction of the radiant heat energy 600 that arrived from the process at outer heat shield 510 is transferred from inner heat shield 505 to primary endblock housing 308. Once again at primary endblock housing 308 a portion of the heat energy is absorbed. Once absorbed the energy is re-radiated from both sides of primary endblock housing 308. Between primary endblock housing 308 and inner heat shield 505 there is a vacuum, but within primary endblock housing 308 there is atmospheric pressure. The air within the housing is circulated and vented and thus the air molecules will largely absorb the heat through convection. Therefore only a very small fraction of the radiant heat energy 600 from the high energy sputtering process is actually transferred to the interior of primary endblock housing 308, and what is transferred is cooled by the forced air flow. This forced air also removes the internally generated heat from either the drive mechanisms inside drive endblock 200 or the electrical transfer system inside water endblock 300. If the intense heat from rotating the target tube and the high powered sputtering process is not effectively dealt with, the magnetron will have a very short service life between repairs or will fail entirely after a short time. Mitigating the heat requires water cooling of the components, multiple heat shielding, and forced air cooling.

While particular embodiments of the present invention and their advantages have been shown and described, it should be understood that various changes, substitutions, and alterations can be made therein without departing from the spirit and scope of the invention as defined by the appended claims.

What is claimed is:

1. A cylindrical magnetron comprising:
   a target tube;
   a first endblock comprising:
      a motor;
      a gearbox; and
      a drive assembly between the gearbox and the target tube with one or more axially compliant interfaces between gears of the drive assembly such that the assembly accommodates imperfect rotation of the target tube.

2. The magnetron of claim 1 further comprising:
   a second endblock comprising:
      an inner housing comprising:
         a water cooled spindle
         an electrical transfer system including brush blocks contacting the surface of the spindle;
      an outer housing;
      compliant seal rings between the inner and outer housing whereby the inner housing can move within the outer housing to absorb imperfect rotation of the target tube.

3. The magnetron of claim 1 further comprising:
   an inner housing within the first endblock, the gearbox and drive assembly within the inner housing;
   an outer housing; and
   compliant seal rings between the inner and outer housing whereby the inner housing can move within the outer housing to absorb imperfect rotation of the target tube.

4. The magnetron of claim 3 wherein the imperfect rotation of the target tube includes eccentric rotation about the axis of rotation of the target tube or movement of the target tube along the axis of rotation.

5. The magnetron of claim 1 wherein the drive assembly comprises first, second and third gears, the rotating motion from the gearbox transferred from the gearbox to the first gear, the rotating motion from the first gear transferred to the second gear, and the rotating motion from the second gear transferred to the third gear.

6. The magnetron of claim 5 wherein the second gear is located between the first and third gear and is electrically insulating.

7. The magnetron of claim 5 wherein an axially compliant interface of the one or more axially compliant interfaces is between the first and second gear.

8. The magnetron of claim 5 wherein an axially compliant interface of the one or more axially compliant interfaces is between the second and third gear.

9. The magnetron of claim 5 wherein the third gear is coupled to the target tube.

10. The magnetron of claim 5 wherein the first gear has one or more slots, and wherein one or more protrusions of the gearbox rotate freely within the slots until encountering the end of the slot and thereafter rotate the entire third gear.

11. The magnetron of claim 10 wherein the one or more protrusions are aligned anywhere within the one or more slots during assembly of the magnetron.

12. A sputtering device having a rotating target tube suspended between first and second endblocks, the first endblock having a suspension and drive system comprising:
   a primary housing;
   a secondary housing held within the primary housing by insulative and pliable components such that the secondary housing can move within the primary housing, the secondary housing comprising a system of interlocking male and female components rotating about an axis and coupling a gearbox to the target tube.

13. The sputtering device of claim 12 wherein the first endblock further comprises a gearbox held within the primary housing by insulative and pliable components such that the gearbox can move within the primary housing.

14. The sputtering device of claim 12 wherein the interlocking male and female components are free to move with six degrees of freedom about the axis of rotation.

15. A device for plasma coating a substrate having a target tube that rotates about an axis of rotation, the device comprising:
   a motor;
   a gearbox;
   a driveline linking the gearbox and the target tube, the driveline able to pivot about the axis of rotation.

16. The device of claim 15 wherein the driveline comprises one or more male and one or more female interconnecting components.

17. The device of claim 16 wherein one of the male or female interconnecting components is made of an insulating material thereby insulating the motor and gearbox from the target tube.

18. The device of claim 15 wherein the driveline is further able to move along the axis of rotation to absorb imperfect rotation of the target tube.

19. The sputtering device of claim 15 further comprising a rotating shaft that transfers power to the target tube.

20. The sputtering device of claim 19 further comprising one or more brush blocks that transfer power to the rotating shaft.

21. The sputtering device of claim 20 wherein the one or more brush blocks are concentrically disposed about the rotating shaft, and are compressively kept in contact with the shaft.

22. The sputtering device of claim 19 wherein cooling water flows through the rotating shaft and into the target tube.

23. The sputtering device of claim 19 wherein a non rotating shaft is within the rotating shaft, and wherein the non rotating shaft locates and supports a magnetic array within the target tube.

24. The sputtering device of claim 15 further comprising a shield connected to a primary housing and electrically isolated from the primary housing.

25. The sputtering device of claim 24 wherein the shield comprises an inner shield and an outer shield electrically isolated from each other.

26. A device for plasma coating a substrate having a target tube that rotates about an axis of rotation, the device comprising:
    an electrical transfer system capable of transferring power to the target tube, the transfer system comprising:
        a shaft electrically contacting and rotating with the target tube;
        a brush block in contact with a first region of the shaft, wherein water flows through the shaft and the target tube, and wherein the brush block transfers the power to the shaft and wherein current travels in a path from the brush block through the shaft to the target tube; and
        a non-metallic bearing in the current path and disposed about a second region of the shaft.

27. The device of claim 26 wherein the electrical transfer system is capable of transferring both alternating and direct current.

28. The device of claim 26 wherein the second region of the shaft is coated with chromium oxide.

29. The device of claim 28 wherein the chromium oxide is diamond polished.

30. The device of claim 26 wherein the shaft is made of 304 stainless steel thereby minimizing the effects of inductive heating.

31. The device of claim 26 wherein the non-metallic bearing is a ceramic bearing that does not inductively heat.

32. The device of claim 26 further comprising first and second vacuum seals disposed about the second region of the shaft.

33. The device of claim 32 wherein the first and second vacuum seals are made of a non metallic material that does not inductively heat.

34. The device of claim 32 further comprising a switch to detect a breach between the first and second vacuum seals.

35. The device of claim 26 further comprising first and second water seals disposed about a third region of the shaft, the third region coated with chromium oxide.

36. The device of claim 35 further comprising a switch to detect a breach between the first and second water seals.

37. The device of claim 35 further comprising a port between the first and second water seals whereby in the event the first seal is breached the water may flow out of the port thereby reducing the pressure on the second water seal.

38. The device of claim 26 wherein the brush block comprises graphite and copper.

39. The device of claim 26 wherein the brush block comprises four or more discrete radial segments.

40. The device of claim 39 wherein the brush block segments are held against the a first surface with a spring that can be unhooked to remove the brush block segments.

41. The device of claim 26 wherein the first region is coated with chromium oxide wear resistant coating.

42. A magnetron having a first and second endblock and a rotating target tube, the first endblock comprising:
    a motor;
    a gearbox electrically isolated from the motor;
    a driveline within a first inner housing and having an insulating member connecting the gearbox to the target tube;
    a first outer housing containing the first inner housing and electrically isolated from the first inner housing.

43. The magnetron of claim 42 further comprising a shield electrically isolated from the first outer housing.

44. The magnetron of claim 43 wherein the shield comprises an outer shield electrically, isolated from an inner shield.

45. The magnetron of claim 44 wherein the outer shield protects against heat energy and wherein the outer shield reflects a first fraction of the heat energy in a vacuum and radiates a second fraction of heat energy in a vacuum towards the inner shield.

46. The magnetron of claim 45 wherein the inner shield receives the second fraction of radiated heat energy and radiates a third fraction of the heat energy towards the first outer housing.

47. The magnetron of claim 46 wherein the first outer housing is internally cooled with forced air.

48. The magnetron of claim 42 wherein the second endblock comprises a water cooled electrical transfer system within a second inner housing.

49. The magnetron of claim 48 wherein the water cooled electrical transfer system is within a second outer housing and is electrically isolated from the second outer housing.

50. An endblock of a cylindrical magnetron having a target tube supplied with an electrical potential, the endblock comprising:
    an isolation plate having a groove;
    a shield electrically isolated from the isolation plate and the target tube and positioned between the groove and the target tube such that stray material on a trajectory from the target tube cannot completely fill the groove.

51. The endblock of claim 50 wherein the unfilled portion of the groove forms a shadow space preventing electrical transfer between the heat shield and the isolation plate.

52. The endblock of claim 50 wherein the unfilled portion of the groove forms a shadow space preventing electrical transfer between the electrical potential supplied to the target tube and other components of the magnetron.

53. A magnetron including a rotating target tube for sputtering onto a substrate comprising:
    a first endblock having means for rotating the target tube, the means for rotating the target tube moveable to accommodate imperfections in the rotation of the target tube.

54. The magnetron of claim 53 further comprising a second endblock comprising means for providing electricity to the target tube, the means for providing electricity having water cooling means to cool the second endblock and the target tube.

55. The magnetron of claim 54 wherein the second endblock further comprises means for supporting a stationary magnetic array within the target tube.

56. The magnetron of claim 54 wherein the first and second endblocks further comprise a means for shielding the endblocks from the sputtering process.

57. The magnetron of claim 53 wherein the means for rotating the target tube comprises interlocking male and female components.

58. The magnetron of claim 53 wherein the means for rotating the target tube comprises means for electrically isolating the target tube from the sputtering process.

59. A magnetron having an endblock comprising a water cooled electrical transfer system within an inner housing, the inner housing within an outer housing and electrically isolated from the outer housing, the outer housing electrically isolated from a shield around the outer housing.

* * * * *